United States Patent [19]

Ho et al.

[11] Patent Number: 5,043,411
[45] Date of Patent: Aug. 27, 1991

[54] CYANATE ESTER RESIN COMPOSITION CONTAINING AN EPOXY/AROMATIC ADDUCT

[75] Inventors: Kam W. Ho; Adrian Cassola, both of Sarnia, Canada

[73] Assignee: Nova Petrochemicals Inc., Sarnia, Canada

[21] Appl. No.: 522,839

[22] Filed: May 14, 1990

[51] Int. Cl.$^5$ .............................................. G08G 73/06
[52] U.S. Cl. ..................................... 528/99; 528/105; 528/119; 528/127; 528/361; 528/363; 528/405; 528/407
[58] Field of Search ................ 528/99, 105, 119, 361, 528/363, 405, 407, 127

[56] References Cited

U.S. PATENT DOCUMENTS

| | | | |
|---|---|---|---|
| 4,480,082 | 10/1984 | McLean et al. | 528/103 |
| 4,554,346 | 11/1985 | Gaku et al. | 528/363 |
| 4,559,399 | 12/1985 | Mefner, Jr. | 528/363 X |
| 4,612,359 | 9/1986 | Hefner, Jr. | 528/363 X |
| 4,739,028 | 4/1988 | McLean et al. | 528/103 |
| 4,804,740 | 2/1989 | Gardner et al. | 528/119 X |
| 4,816,533 | 3/1989 | McLean et al. | 525/526 |
| 4,918,157 | 4/1990 | Gardner et al. | 528/119 X |

OTHER PUBLICATIONS

U.S. Ser. No. 430,864 filed Oct. 23, 1989.

*Primary Examiner*—Earl Nielsen
*Attorney, Agent, or Firm*—Stevens, Davis, Miller & Mosher

[57] ABSTRACT

The present invention generally relates to a thermosettable cyanate ester resin composition which contains a fortifier that is the reaction product of an epoxy and an aromatic reactant selected from an aromatic amine and an aromatic amide. Thermoset cyanate ester resin compositions of the present invention have improved flexural strength and/or flexural modulus. The compositions of the present invention may be used to prepare circuit boards or molded parts.

9 Claims, No Drawings

CYANATE ESTER RESIN COMPOSITION CONTAINING AN EPOXY/AROMATIC ADDUCT

FIELD OF THE INVENTION

This invention generally relates to cyanate ester resin compositions having improved flexural strength and/or flexural modulus. The compositions of the present invention contain a fortifier additive which is the reaction product of a suitable epoxide and an aromatic reactant selected from an aromatic amide and an aromatic amine.

BACKGROUND OF THE INVENTION

The use of fortifiers to improve the properties of epoxy resins is disclosed in U.S. Pat. Nos. 4,739,028, 4,480,082 and 4,816,533, the disclosures of which are incorporated herein by reference.

In addition, the use of fortifiers to improve bismaleimide resins is disclosed in our copending application, U.S. Ser. No. 430,864 (filed 23 Oct. 1989).

It has now been surprisingly discovered that selected "epoxy fortifiers" may be employed to prepare thermoset cyanate ester resins having improved flexural properties.

SUMMARY OF THE INVENTION

The present invention provides a thermosettable cyanate ester resin composition comprising i) a thermosettable cyanate ester resin, ii) a fortifier consisting of the reaction product of a suitable epoxide and an aromatic reactant selected from an aromatic amine and an aromatic amide, and iii) catalyst.

The invention also provides a thermoset resin which is prepared by curing the inventive thermosettable resin.

DETAILED DESCRIPTION

Thermosettable cyanate ester resins are bisphenol derivatives which contain a cyanate functional group (i.e. —OCN). More specifically, they are esters of a bisphenol and cyanic acid.

Cyanate ester resins are well known articles of commerce. A detailed description of cyanate ester resin technology is given by D. A. Shimp et al in a paper presented at the 34th Internal SAMPE Symposium, 1989 (the symposium papers were published by the Society for the Advancement of Material and Process Engineering, edited by G. A. Zakrzewski et al, volume 34, Book 1 of 2, p. 222, 1989).

Illustrative examples of cyanate ester resins which are suitable for use in the present invention are described by the chemical structure formulae given below:

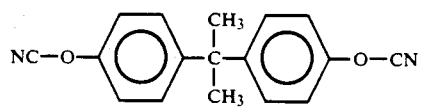
(1)

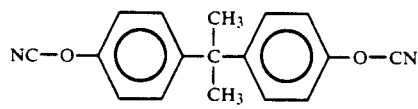
(2)

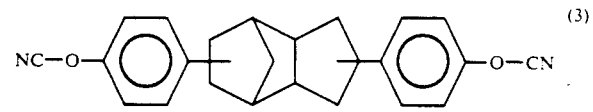
(3)

A cyanate ester resin of formula-(1) above is preferred for use in the present invention. Such a cyanate ester resin is sold under the trademark AROCY B-10 by Hi-Tek Polymers of Louisville, Ky., U.S.A.

The fortifier of the present invention is the reaction product of a suitable epoxy and a selected aromatic reactant.

The epoxy which is suitable for use in the present invention is selected from (i) a diepoxide and (ii) a monoepoxide of the formula

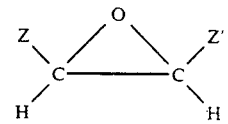

wherein Z and Z' are independently selected from hydrogen, halogen, $C_{1-4}$ alkyl, halogenated C alkyl, phenyl, halogenated phenyl and an alkylene-linked aromatic ether.

The term "diepoxide" refers to a structure having two epoxide rings. It is preferred to employ an "unsymmetrical diepoxide" (i.e. a diepoxide in which one of the epoxide rings is less active than the other, as may be obtained through appropriate substitution). Suitable diepoxides include vinyl cyclohexene dioxide, 3,4 epoxy cyclohexyl methyl-3', 4',-epoxy cyclohexyl carboxylate, bis(2,3 epoxycyclopentyl) ether and p-epoxycyclopentylphenyl glycidyl ether. Suitable monoepoxides include ethylene oxide, styrene oxide, propylene oxide and phenylglycidyl ether ("PGE"), of which PGE is preferred.

The "aromatic reactant" used to prepare suitable fortifiers is selected from a defined aromatic amine and a defined aromatic amide.

The aromatic amine is defined by the formula:

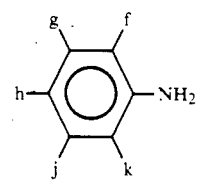

wherein f, g, h, j and k are independently selected from hydrogen, $C_{1-4}$ alkyl, halogen, halogenated $C_{1-4}$ alkyl, phenyl, halogenated phenyl, hydroxyl, amino, carboxylic acid, an alkylene-linked aromatic amine moiety, an alkylene-linked aromatic amide moiety

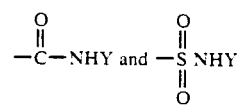

wherein Y is selected from H, $C_{1-4}$ alkyl, phenyl and carboxylic acid. As used herein, the term "alkylene-linked" refers to an alkylene linkage having less than 5 carbon atoms. Suitable examples of this aromatic amine include aniline, methylenedianiline, m-phenylenediamine, 4-chloroaniline, 4-bromoaniline, 2,4,6-tribromoaniline, 2,4,6-trichloroaniline, ortho-toluidene, meta or para-aminophenol, sulfanilamide and para-aminobenzoic acid.

The aromatic amide is defined by the formula:

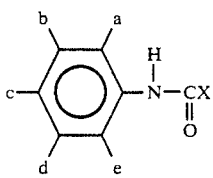

wherein said a, b, c, d and e are independently selected from hydrogen, hydroxyl, $C_{1-4}$ alkyl, halogen, halogenated $C_{1-4}$ alkyl, amino and an alkylene-linked aromatic amide moiety and wherein X is selected from hydrogen, $C_{1-4}$ alkyl, phenyl and

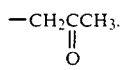

Suitable examples of this aromatic amide include acetanilide, acetoacetanilide, 4-hydroxyacetanilide, 2-hydroxyacetanilide, 4-amino-acetanilide, 4-chloroacetanilide, 4-bromoacetanilide, di(4-formamidodiphenyl) methane, 2′4′,-dichloroacetanilide.

The fortifier is prepared by reacting the aforedefined epoxy and the aforedefined aromatic reactant at an elevated temperature, preferably from 70° C. to 230° C. (especially from 120° C. to 180° C.) for from 15 minutes to 24 hours.

The reaction is exothermic, so cooling of the reaction vessel may be required. As will be readily appreciated by those skilled in the art of chemical synthesis involving exothermic reactions, it is preferred to allow the reaction temperature to increase as the reaction progresses (in order to facilitate the reaction, while still maintaining the capability to control the reaction in a manner which prevents an undesired sudden increase in temperature). The preferred molar ratio of epoxy to aromatic reactant is from 1:1 to 10:1, especially from 1.1:1 to 5:1.

The reaction to prepare the fortifier may be assisted by a catalyst such as diethylamine hydrochloride, ethylmethylimidazole, alpha-methylbenzyldimethylamine, 2-hydroxybenzyldimethylamine or hindered phenols such as 2,6-di-tertiary-butyl-alpha-dimethylamine-para cresol. When employed, a preferred catalyst concentration is from 0.01 to 0.4 weight percent.

Thermoset cyanate ester resin compositions having improved flexural modulus are obtained by incorporating an effective quantity of the above described fortifiers. The preferred quantity of fortifier is from 5 to 30 parts by weight, based on 100 parts by weight of cyanate ester resin.

The thermoset cyanate ester resin compositions of the present invention may be prepared by curing the above described thermosettable compositions using techniques which are conventionally employed for the curing of cyanate ester resins. Cyanate ester resins are conventionally cured using a two component catalyst consisting of:

i) a hydrogen source (such as nonylphenol, especially in an amount from 1 to 6 parts by weight per 100 parts by weight cyanate ester resin), and ii) a soluble coordination metal compound (such as zinc naphthenate, zinc octoate or cobalt acetylacetonate), especially in an amount of from 0.05 to 0.5 parts by weight per 100 parts by weight cyanate ester resin.

The present invention does not depend on the use of any specific catalyst, provided that the catalyst is suitable for use with cyanate ester resin.

The present compositions may further contain additives, fillers and reinforcing agents which are typically used with cyanate ester resins (such as filaments, yarns and fabrics).

Further details are provided by the following examples, in which all parts are by weight unless otherwise indicated.

EXAMPLE 1

This example illustrates the preparation of a fortifier from a monoepoxide and an aromatic amide, and the subsequent use of the fortifier to prepare a thermoset cyanate ester resin having surprising flexural modulus.

The fortifier of this example was prepared by adding 204.6 parts of phenyl glycidyl ether ("PGE"), 136.4 parts of 4-hydroxyacetanilide ("4HAA") and 1.02 parts of 2,6-di-tert-butyl-α-dimethylamino-p-cresol (as catalyst) to a stirred reactor, gradually heating to 130° C., then allowing the temperature to rise from 130° C. to 220° C. over a ten hour period.

The resulting fortifier, referred to hereafter as "PGE/4HAA fortifier", was allowed to gradually cool and was then removed from the reactor.

Thermosettable cyanate ester resins were than prepared as described below.

The cyanate ester used in this example is described by the following structural formula:

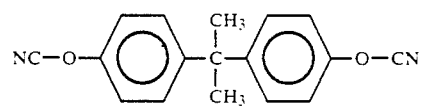

and is hereinafter referred to as cyanate ester resin-(1). A comparative thermoset resin for this Example (and Examples 2–3) was prepared from a thermosettable composition consisting of 100 grams of cyanate ester resin-(1), 0.13 grams of zinc naphthenate and 2.0 grams of nonylphenol. The composition was mixed well and then cured according to the conventional curing cycle described below.

1. Pour the composition into a flat plate mold (preheated to 110° C.).
2. Cure as follows:
   i) 1 hour at 150° C., followed by
   ii) 3 hours at 175° C., and
   iii) 3 hours at 250° C.

The resulting thermoset resin was tested for flexural strength and flexural modulus (according to the test procedures of ASTM D790).

The comparative resin was found to have a flexural strength of 77 MPa and a flexural modulus of 3759 MPa.

An inventive thermosettable resin composition was then prepared from 100 grams of cyanate ester resin-(1), 0.13 grams of zinc naphthenate, 2.0 grams of nonylphenol and 15 grams of the PGE/4HAA fortifier. The inventive composition was then cured using the above described curing cycle. The inventive resin was found to have a flexural strength of 115 MPa (49% higher than that of the comparative resin) and a flexural modulus of 4469 MPa (19% higher than that of the comparative resin).

A second inventive composition was prepared using 100 grams of the cyanate ester resin-(1), 0.13 grams of zinc naphthenate, 2.0 grams of nonylphenol and 25 grams of the PGE/4HAA fortifier.

This inventive composition was also cured using the above described curing cycle. ASTM testing on the resulting thermoset resin showed it to have a flexural strength of 134 MPa (74% higher than that of the comparative resin) and a flexural modulus of 4862 MPa (29% higher than that of the comparative resin).

EXAMPLE 2

This example illustrates the preparation of a fortifier from a monoepoxide and an aromatic amide, and the subsequent use of the fortifier to prepare a thermoset cyanate ester resin having surprising flexural modulus.

The fortifier of this example was prepared by adding 42.0 parts of phenyl glycidyl ether ("PGE"), 35.4 parts of acetoacetanilide ("AAA") and 0.19 parts of 2-ethyl-4-methylimidazole (as catalyst) to a stirred reactor, gradually heating to 100° C, then allowing the temperature to rise from 100° C. to 160° C. over an 8 hour period.

The resulting fortifier, referred to hereafter as "PGE-/AAA fortifier", was allowed to gradually cool and was then recovered from the reactor.

Thermosettable cyanate ester resins were then prepared as described below.

An inventive thermosettable resin composition was then prepared from 100 grams of cyanate ester resin-(1), 0.13 grams of zinc naphthenate, 2.0 grams of nonylphenol and 15 grams of PGE/AAA fortifier. The inventive composition was then cured using the curing cycle described in Example 1. The resulting thermoset resin was tested and found to have a flexural strength of 173 MPa (124% higher than that of the comparative resin) and a flexural modulus of 4690 MPa (25% higher than that of the comparative resin).

A second inventive composition was prepared using 100 grams of cyanate ester resin-(1), 0.13 grams of zinc naphthenate, 2.0 grams of nonylphenol and 25 grams of PGE/AAA fortifier. This inventive composition was also cured using the curing cycle described in Example 1. ASTM testing on the resulting thermoset resin showed it to have a flexural strength of 148 MPa (92% higher than that of the comparative resin) and a flexural modulus of 4834 MPa (29% higher than that of the comparative resin).

EXAMPLE 3

This example illustrates the preparation of a fortifier from a diepoxide and an aromatic amine, and the subsequent use of the fortifier to prepare a thermoset cyanate ester resin having surprising flexural modulus.

The fortifier of this example was prepared by adding 66.5 parts of 3,4 epoxy cyclohexyl methyl-3'4'-epoxy cyclohexyl carboxylate ("ECM") and 11.35 parts of sulfanilamide ("SAA") to a stirred reactor, gradually heating to 150° C and maintaining the temperature at 150° C. for 1 hour.

The resulting fortifier, referred to hereinafter as "ECM/SAA fortifier", was allowed to gradually cool and was then recovered from the reactor.

Thermosettable cyanate ester resins were then prepared as described below.

An inventive thermosettable resin was then prepared from 100 grams of cyanate ester resin-(1), 0.13 grams of zinc naphthenate, 2.0 grams of nonylphenol and 15 grams of ECM/SAA fortifier. The inventive composition was cured using the curing cycle described in Example 1. The resulting thermoset resin was tested and found to have a flexural strength of 110 MPa (43% higher than that of the comparative resin) and a flexural modulus of 4510 MPa (20% higher than that of the comparative resin).

A second inventive composition was prepared using 100 grams of cyanate ester resin-(1), 0.13 grams of zinc naphthenate, 2.0 grams of nonylphenol and 25 grams of ECM/SAA fortifier. This inventive composition was cured using the curing cycle described in Example 1. ASTM testing on the resulting thermoset resin showed it to have a flexural strength of 125 MPa (62% higher than that of the comparative resin) and a flexural modulus of 4945 MPa (32% higher than that of the comparative resin).

EXAMPLE 4

This Example illustrates the use of the fortifier described in Example 2 to improve the properties of another cyanate ester resin.

The cyanate ester resin used in this Example is described by the following structural formula:

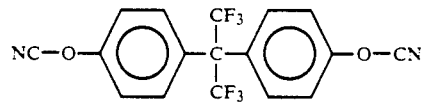

and is hereinafter referred to as cyanate ester resin-(2). A comparative thermoset resin (referred to as comparative resin 2) was prepared from a composition consisting of 100 grams of cyanate ester resin-(2), 0.13 grams of zinc naphthenate and 2.0 grams of nonylphenol. The composition was mixed well and then cured according to the curing cycle described in Example 1. Comparative resin 2 was tested and found to have a flexural strength of 57 MPa and a flexural modulus of 3690 MPa.

An inventive thermosettable resin composition was then prepared from 100 grams of cyanate ester resin-(2), 0.13 grams of zinc naphthenate, 2.0 grams of nonylphenol and 15 grams of the PGE/AAA fortifier described in Example 2. The composition was then cured using the curing cycle described in Example 1. The resulting thermoset resin was then tested and found to have a flexural strength of 92 MPa (60% higher than that of comparative resin 2) and a flexural modulus of 4700 MPa (27% higher than that of comparative resin 2).

What is claimed is:

1. A thermosettable resin composition comprising a cyanate ester resin, a fortifier and catalyst, wherein said fortifier is the reaction product of a suitable epoxide and an aromatic reactant, characterized in that said aromatic reactant is selected from:

i) an aromatic amide of the formula:

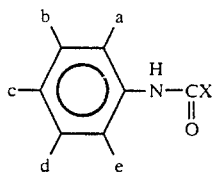

wherein said a, b, c, d and e are independently selected from hydrogen, hydroxyl, $C_{1-4}$ alkyl, halogen, halogenated $C_{1-4}$ alkyl, amino and an alkylene-linked aromatic amide moiety and wherein X is selected from hydrogen, $C_{1-4}$ alkyl, phenyl and

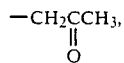

and
ii) an aromatic amine of the formula:

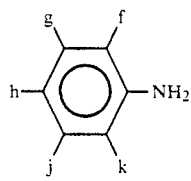

wherein said f, g, h, j and k are independently selected from hydrogen, $C_{1-4}$ alkyl, halogen, halogenated $C_{1-4}$ alkyl, phenyl, halogenated phenyl, hydroxyl, amino, carboxylic acid, an alkylene-linked aromatic amine, an alkylene-linked aromatic amide,

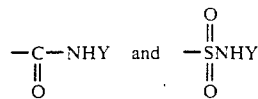

wherein said Y is selected from H, $C_{1-4}$ alkyl, phenyl and carboxylic acid.

2. The composition of claim 1 wherein said epoxide is phenyl glycidyl ether.

3. The composition of claim 2 wherein said aromatic reactant is 4-hydroxyacetanilide.

4. The composition of claim 2 wherein said aromatic reactant is acetoacetanilide.

5. The composition of claim 1 wherein said fortifier is the reaction product of epoxy cyclohexyl carboxylate and sulfanilamide.

6. The composition of claim 4 wherein said cyanate ester resin is described by the following chemical formula:

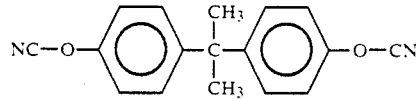

7. The composition of claim 6 wherein said catalyst consists of nonylphenol and zinc naphthenate.

8. The composition of claim 1 wherein the amount of said fortifier is from 5 to 30 parts by weight per 100 parts by weight of said cyanate ester resin.

9. The thermoset resin obtained by curing the composition of claim 1.

* * * * *